United States Patent
Liu et al.

(10) Patent No.: US 8,258,598 B2
(45) Date of Patent: Sep. 4, 2012

(54) E-FUSE AND ASSOCIATED CONTROL CIRCUIT

(75) Inventors: Chi Kang Liu, Hsinchu Hsien (TW); Chin-Wei Lin, Hsinchu Hsien (TW); Min-Nan Hsieh, Hsinchu Hsien (TW)

(73) Assignee: MStar Semiconductor, Inc. (TW)

( * ) Notice: Subject to any disclaimer, the term of this patent is extended or adjusted under 35 U.S.C. 154(b) by 324 days.

(21) Appl. No.: 12/702,984

(22) Filed: Feb. 9, 2010

(65) Prior Publication Data

US 2010/0213551 A1    Aug. 26, 2010

(30) Foreign Application Priority Data

Feb. 24, 2009    (TW) ............................. 98105835 A

(51) Int. Cl.
*H01L 29/00* (2006.01)

(52) U.S. Cl. ........................................ 257/529; 257/665
(58) Field of Classification Search .................. 257/665, 257/529
See application file for complete search history.

(56) References Cited

U.S. PATENT DOCUMENTS 6,580,156 B1 *    6/2003    Ito et al. ........................ 257/665

* cited by examiner

*Primary Examiner* — Thien F Tran
(74) *Attorney, Agent, or Firm* — Han IP Law PLLC; Andy M. Han

(57) ABSTRACT

An e-fuse and an e-fuse control circuit are provided. The e-fuse includes a polysilicon layer and a metal silicide layer stacked on the polysilicon layer. The e-fuse operates in an open state when the silicide layer is broken by burning while one portion of the polysilicon layer is exposed.

17 Claims, 5 Drawing Sheets

E-FUSE AND ASSOCIATED CONTROL CIRCUIT

CROSS REFERENCE TO RELATED PATENT APPLICATION

This patent application claims priority from Taiwan Patent Application No. 098105835, filed in the Taiwan Patent Office on Feb. 24, 2009, entitled "E-Fuse and Associated Control Circuit", and incorporates the Taiwan patent application in its entirety by reference.

TECHNICAL FIELD

The present disclosure relates to an e-fuse, and more particularly, to an e-fuse and associated control circuit.

BACKGROUND OF THE DISCLOSURE

Generally speaking, a manufacturing process of an e-fuse is the same as that of a gate of a metal-oxide semiconductor (MOS) transistor. Therefore, during the manufacturing process of an integrated circuit, the e-fuse and the gate of the MOS transistor are manufactured simultaneously.

FIGS. 1A to 1E illustrate schematic diagrams of a conventional manufacturing process of an e-fuse and a gate of a MOS transistor. Referring to FIG. 1A, an insulation layer 20 is formed on a semiconductor substrate 10. Generally, the material of the insulation layer 20 is $SiO_2$. The left side of a dashed line is a MOS transistor region, and the right side of the dashed line is a non-MOS transistor region.

Referring to FIG. 1B, a highly doped polysilicon layer 30 is first formed on the insulation layer 20. Photo-etching is then applied to define a channel length 15 of the gate of the MOS transistor as well as drain and source regions in the MOS transistor region. Simultaneously, a position of the e-fuse is defined in the non-MOS transistor region. A first ion implantation is performed in the MOS transistor region to form a lightly doped region 16 (e.g., less than $10^{18}$ atoms/cc) on the semiconductor substrate 10. Referring to FIG. 1C, a side wall 32 is formed at the gate of the MOS transistor in the MOS transistor region. A second ion implantation is then performed to form a highly doped region 17 on the semiconductor substrate 10. Referring to FIG. 1D, the insulation layer 20 on the surface of the highly doped region 17 is removed.

Referring to FIG. 1E, a silicide layer 35 is formed in the MOS transistor region to form a source and a drain of the MOS transistor on the surface of the highly doped region 17, and the silicide layer 35 is stacked on the highly doped polysilicon layer 30 to form a metal contact point of the gate. At this stage, the silicide layer 35 is also formed in the non-MOS transistor region, and the silicide layer 35 is stacked on the highly doped polysilicon layer 30 to form a conventional e-fuse.

As mentioned above, the gate of the MOS transistor comprises the highly doped polysilicon layer 30 and the silicide layer 35 stacked on the highly doped polysilicon layer 30. During the manufacturing process of the gate, the e-fuse is formed in the non-MOS transistor region. Therefore, the e-fuse also comprises the highly doped polysilicon layer 30 and the silicide layer 35 stacked the highly doped polysilicon layer 30. Generally, the thickness of the highly doped polysilicon layer 30 is about 1K to 2K angstroms, and the resistance of the highly doped polysilicon layer 30 is about several hundred ohms per square unit. The thickness of the silicide layer 35 is about 200 to 300 angstroms, and the resistance of the silicide layer 35 is about 5 to 20 ohms per square unit.

When the e-fuse is formed, it is in a closed state. To change the e-fuse to an open state, a large current needs to flow through the e-fuse to break the e-fuse. That is, the open state of the e-fuse means that the highly doped polysilicon layer 30 and the silicide layer 35 become an open circuit. However, the e-fuse can not change from the open state to the closed state again once the e-fuse is in the open state. Moreover, when an e-fuse control circuit (not shown) is in a programming period, the e-fuse remains in the closed state or changes to the open state. When the e-fuse control circuit is in a read period, a different first level or a different second level is generated according to the open or closed state of the e-fuse.

FIGS. 2A, 2B and 2C show the closed state, the open state and a half-open state of an e-fuse, respectively. Referring to FIG. 2A, when the e-fuse is in the closed state, the highly doped polysilicon layer 30 and the silicide layer 35 are not broken by a burning procedure. Referring to FIG. 2B, when the e-fuse is in the open state, the highly doped polysilicon layer 30 and the silicide layer 35 are broken by the burning procedure.

Please refer to FIG. 2C. The resistance of the silicide layer 35 at the upper layer of the e-fuse is smaller than that of the highly doped polysilicon layer 30 at the lower layer of the e-fuse. Therefore, during the programming period, a major portion of the current flows through the silicide layer 35 at the upper layer and a minor portion of the current flows through the highly doped polysilicon layer 30 at the lower layer. Often, a circumstance that the highly doped polysilicon layer 30 is not broken by burning procedure while the silicide layer 35 is already broken occurs, as is the case shown in FIG. 2C.

When the e-fuse is changed to the half-open state after the programming period of the e-fuse control circuit, the e-fuse actually still has a resistance value of about several hundred ohms. Therefore, the e-fuse control circuit cannot correctly output the first or second level during the read period, such that the overall integrated circuit is not able to operate normally. In general, the probability of a conventional e-fuse that is in a half-open state can reach as high as 2% to 3%.

Therefore, the main object of the present disclosure is to provide an e-fuse and associated control circuit, so that the e-fuse can provide a reliable closed or open state to the control circuit with a reduced probability of being in a half-open state.

SUMMARY OF THE DISCLOSURE

An e-fuse is provided according to the present disclosure. The e-fuse comprises a polysilicon layer and a silicide layer stacked on the polysilicon layer. When the silicide layer is broken by burning while the polysilicon layer is not broken completely, the e-fuse operates in an open state.

An e-fuse control circuit is also provided. The e-fuse control circuit comprises an e-fuse, a first MOS transistor, a second MOS transistor, a third MOS transistor, and a fourth MOS transistor. The e-fuse has a first terminal, that receives a select signal, and a second terminal. The first MOS transistor has its drain connected to the second terminal of the e-fuse, its source connected to a ground terminal, and its gate coupled to receive a control signal. The second MOS transistor has its drain connected to the first terminal of the e-fuse, its source connected to a ground terminal, and its gate coupled to receive a read signal. The third MOS transistor has its drain connected to a power source, its source connected to an output terminal, and its gate coupled to receive a bias signal. The fourth MOS transistor has its drain connected to the output terminal, its source connected to the second terminal of the e-fuse, and its gate coupled to receive the read signal.

The advantages and spirit of the present disclosure can be further understood via the following detailed description and drawings. However, the detailed description and drawings shall not be construed as limiting the scope of the present non-obvious inventive concepts disclosed and/or claimed herein.

BRIEF DESCRIPTION OF THE DRAWINGS

Following description and figures are disclosed to gain a better understanding of the advantages of the present disclosure.

DETAILED DESCRIPTION OF THE PREFERRED EMBODIMENT

Figure 1A:
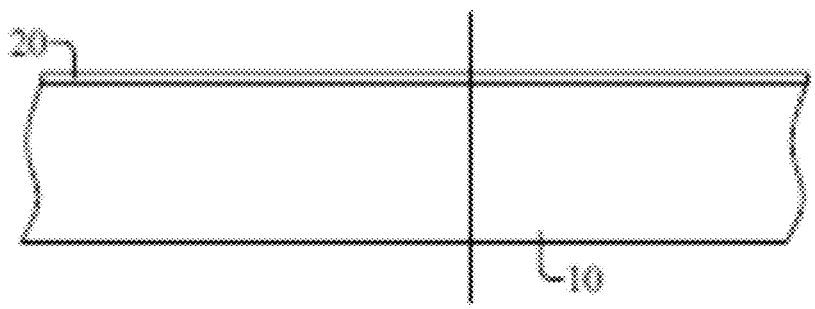
FIGS. 1A to 1E are diagrams showing a conventional manufacturing process of an e-fuse and a gate of a MOS transistor.
Figure 1B:
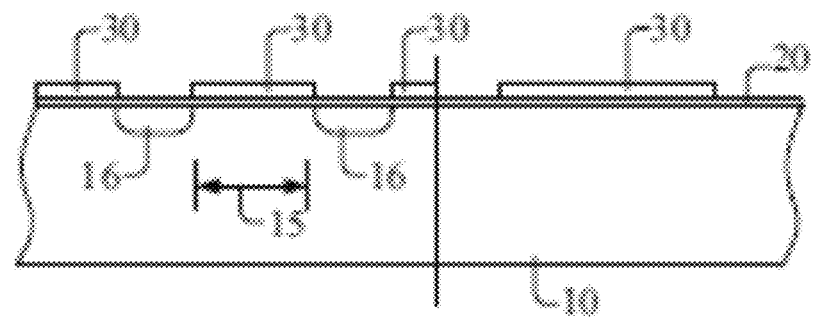
Figure 1C:
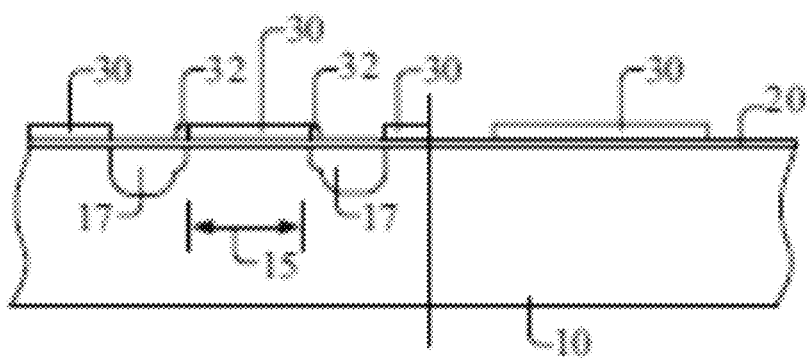
Figure 1D:
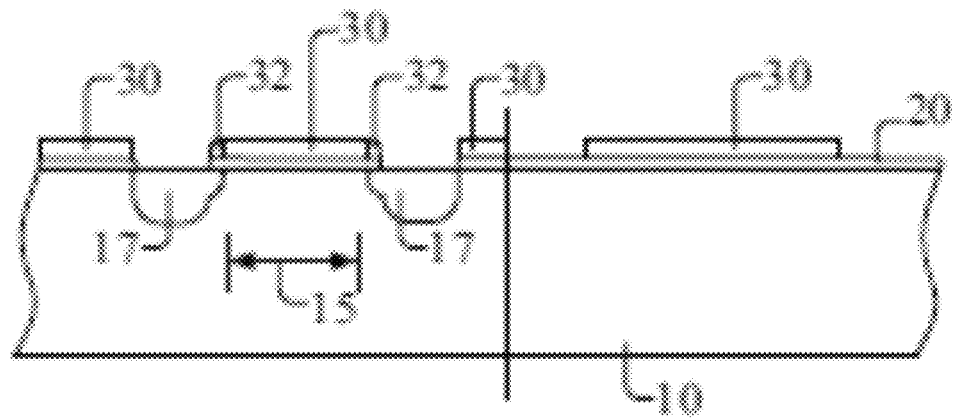
Figure 1E:
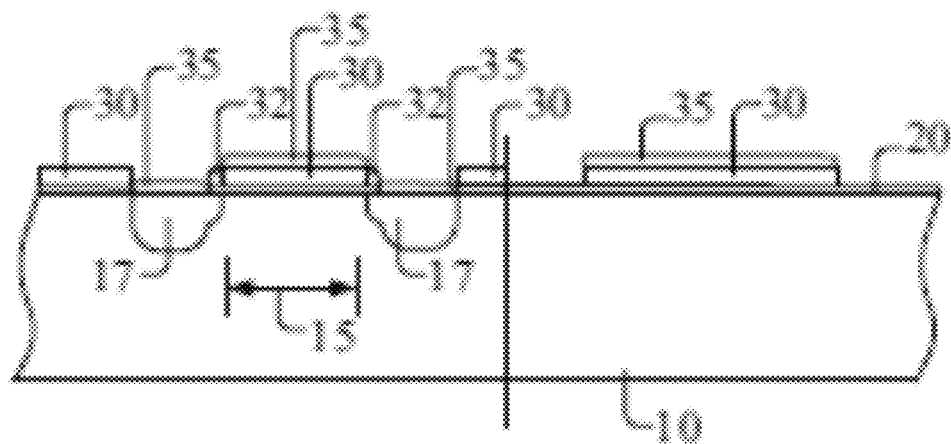
Figure 2A:
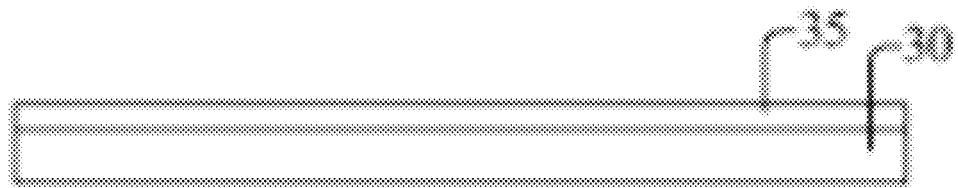
FIGS. 2A, 2B and 2C show an open state, a closed sate, and a half-open sate of a conventional e-fuse respectively.
Figure 2B:
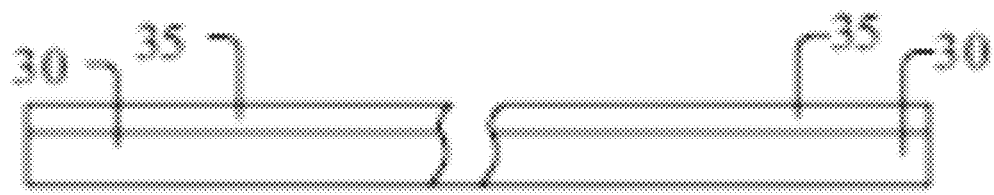
Figure 2C:
Figure 3A:
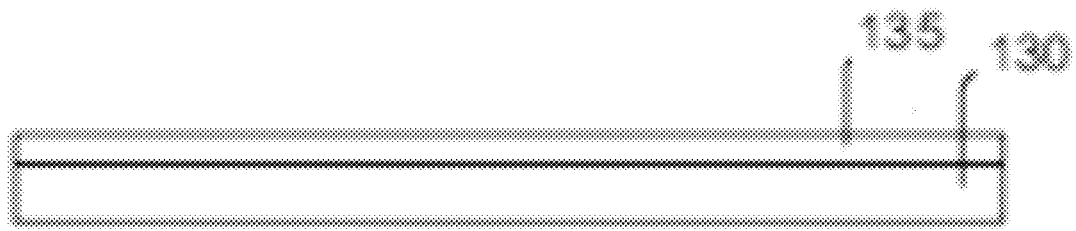
FIG. 3A shows an e-fuse according to one embodiment of the present disclosure.

FIG. 3A shows an e-fuse in accordance with an embodiment of the present disclosure. The e-fuse comprises a lightly doped or un-doped polysilicon layer 130 and a silicide layer 135 stacked on the lightly doped or un-doped polysilicon layer 130. The lightly doped or un-doped polysilicon layer 130 has a thickness of about 1K to 2K angstroms, and a resistance of 20K to 50K ohms per square unit. The silicide layer 135 has a thickness of about 200 to 300 angstroms, and a resistance of 5 to 20 ohms per square unit.

Figure 3B:
FIG. 3B shows an open state of an e-fuse according to one embodiment of the present disclosure.

When the e-fuse is fabricated, it exists in a closed state as illustrated in FIG. 3A. FIG. 3B shows an open state of an e-fuse according to the present disclosure. According to one embodiment of the present disclosure, to change the e-fuse to an open state, a large current is applied to flow through the silicide layer 135 during a programming period of an e-fuse control circuit to break the silicide layer 135. The resistance of the lightly doped or un-doped polysilicon layer 130 at the lower layer of the e-fuse is far greater than that of the silicide layer 135 at the upper layer of the e-fuse. Thus, regardless of whether the lightly doped or un-doped polysilicon player 130 at the lower layer is broken by burning or not, a result of the e-fuse control circuit is not influenced. That is, with the silicide layer 135 broken the e-fuse is treated as in the open state, and a portion of the polysilicon layer 130 is exposed where the polysilicon layer 130 may be unbroken or partially broken. Accordingly, during a read period, the e-fuse control circuit outputs a first level or a second level accurately according to the open state or the closed state of the e-fuse. Therefore, the problem of being in a half-open state with the conventional e-fuse is solved according to the present disclosure.

Figure 4:
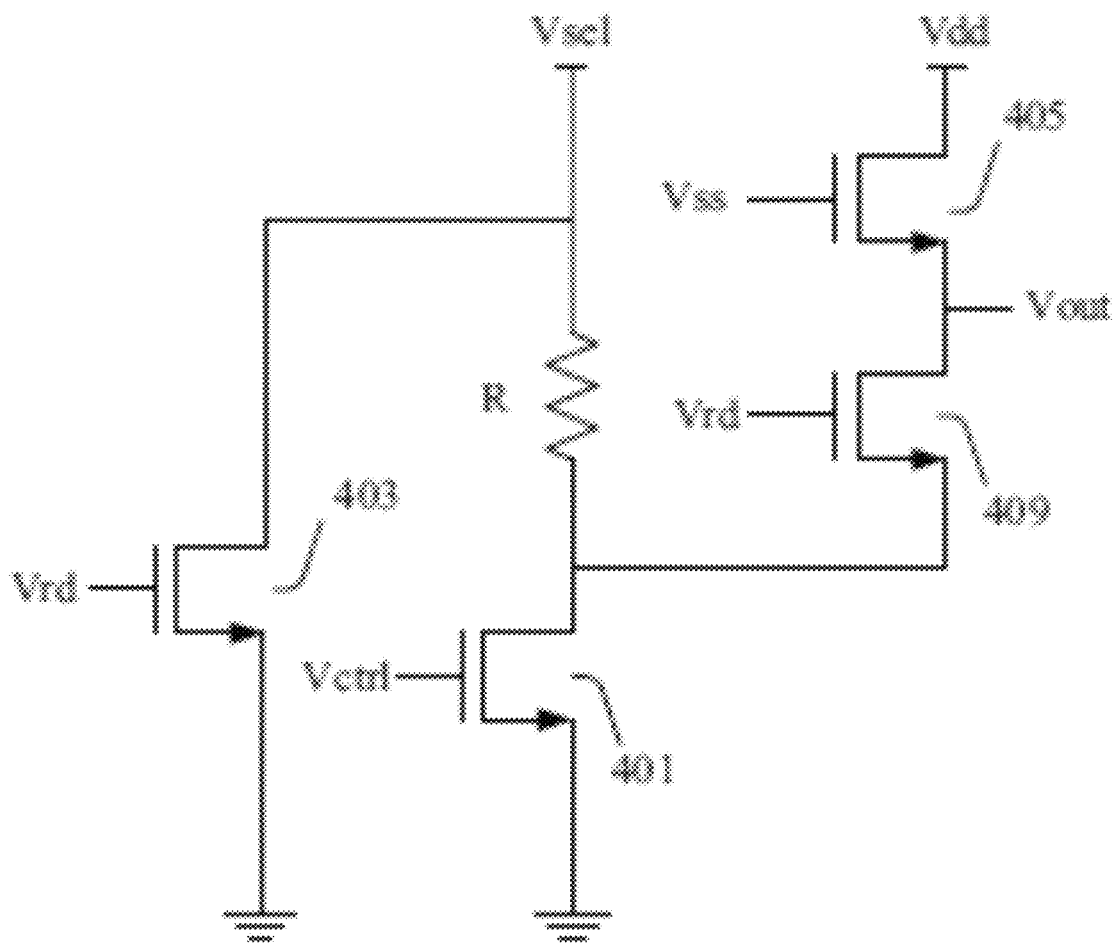
FIG. 4 is a schematic diagram of an e-fuse control circuit in accordance with an embodiment of the present disclosure.

FIG. 4 is an e-fuse control circuit according to one embodiment of the present disclosure. A first terminal of an e-fuse R receives a select signal Vsel. A first MOS transistor 401 has its drain connected to a second terminal of the e-fuse R, its source connected to ground, and its gate coupled to receive a control signal Vctrl. A second MOS transistor 403 has its drain connected to the first terminal of the e-fuse R, its source connected to ground, and its gate coupled to receive a read signal Vrd. A third MOS transistor 405 has its drain connected to a power source Vdd, its source connected to an output terminal Vout, and its gate coupled to receive a bias signal Vss. A fourth MOS transistor 409 has its drain connected to the output terminal Vout, its source connected to the second terminal of the e-fuse R, and its gate coupled to receive the read signal Vrd. The first terminal of the e-fuse is one end of the lightly doped or un-doped polysilicon layer 130 or the silicide layer 135 as illustrated in FIG. 3A, and the second terminal of the e-fuse is the other end of the lightly doped or un-doped polysilicon layer 130 or the silicide layer 135.

In this embodiment, when the e-fuse control circuit is in a programming period, the select signal Vsel is at a high level to change the e-fuse R from the closed state to the open state. Otherwise, when the e-fuse R remains in the closed state, the select signal Vsel is at a low level, the control signal Vctrl is at a high level, and the read signal Vrd is at a low level.

When the select signal Vsel, as well as the control signal Vctrl, is at a high level, a large current path from the select signal Vsel through the e-fuse R and the first MOS transistor 401 to the ground is formed. Consequently, the e-fuse R changes from the closed state to the open state while its resistance reaches several hundred K ohms at this point.

When the select signal Vsel is at a low level and the control signal Vctrl is at a high level, the foregoing current path is absent. Consequently, the e-fuse R remains in the closed state and its resistance stays at about tens of ohms.

When the e-fuse control circuit is in the read period, the read signal Vrd is at a high level, the bias signal Vss can switch on the third MOS transistor 405, the select signal Vsel is floating and the control signal Vctrl is at a low level.

When the e-fuse R is in the closed state and during the read period, the second MOS transistor 403, the third MOS transistor 405 and the fourth MOS transistor 409 switch on simultaneously. Therefore, a divided voltage at the output terminal Vout is close to a ground voltage, and hence the output terminal Vout is at a low level. On the contrary, when the e-fuse R is in the open state and during the read period, the second MOS transistor 403, the third MOS transistor 405 and the fourth MOS transistor 409 switch on simultaneously. Therefore, a divided voltage at the output terminal Vout is close to a source voltage, and hence the output terminal Vout is at a high level. A person having ordinary skill in the art shall understand that the foregoing embodiment of the e-fuse control circuit takes N-type MOS transistor as an example. However, it shall not be construed as limiting other embodiments to only N-type MOS transistors.

Therefore, an advantage of the present disclosure is that it solves the problem that an e-fuse may undesirably be in a half-open state.

While the disclosure has been described in terms of what is presently considered to be the most practical and preferred embodiments, it is to be understood that the disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. An e-fuse, comprising:
   a polysilicon layer, the polysilicon layer having a thickness of 1K to 2K angstroms and further having a resistance of 20K to 50K ohms per square unit; and
   a silicide layer formed on the polysilicon layer,
   the e-fuse operating in an open state when the silicide layer is broken by burning while one portion of the polysilicon layer is exposed.

2. The e-fuse as claimed in claim 1, wherein the silicide layer has a thickness of 200 to 300 angstroms, and a resistance of 5 to 20 ohms per square unit.

3. The e-fuse as claimed in claim 1, wherein when the silicide layer and the polysilicon layer are both broken by burning, the e-fuse operates in the open state.

4. The e-fuse as claimed in claim 1, wherein the polysilicon layer is a lightly doped polysilicon layer.

5. The e-fuse as claimed in claim 1, wherein the polysilicon layer is an un-doped polysilicon layer.

6. An e-fuse control circuit, comprising:
   an e-fuse having a first terminal and a second terminal, the first terminal coupled to receive a select signal;
   a first MOS transistor having a drain coupled to the second terminal of the e-fuse, a source coupled to a ground terminal, and a gate coupled to receive a control signal;
   a second MOS transistor having a drain coupled to the first terminal of the e-fuse, a source coupled to the ground terminal, and a gate coupled to receive a read signal;
   a third MOS transistor having a drain coupled to a power source, a source connected to an output terminal, and a gate coupled to receive a bias signal; and
   a fourth MOS transistor having a drain coupled to the output terminal, a source coupled to the second terminal of the e-fuse, and a gate coupled to receive the read signal.

7. The e-fuse control circuit as claimed in claim 6, wherein during a programming period, the e-fuse is programmed to be in a closed state or an open state according to the select signal and the control signal.

8. The e-fuse control circuit as claimed in claim 7, wherein the e-fuse changes from the closed state to the open state when the control signal is at a high level and the select signal is at a high level.

9. The e-fuse control circuit as claimed in claim 7, wherein the e-fuse remains in the closed state when the control signal is at a high level and the select signal is at a low level.

10. The e-fuse control circuit as claimed in claim 6, wherein during a programming period, the read signal is at a high level, the bias signal biases the third MOS transistor, the select signal is floating and the control signal is at a low level.

11. The e-fuse control circuit as claimed in claim 6, wherein the MOS transistors are N-type transistors.

12. The e-fuse control circuit as claimed in claim 6, wherein the e-fuse comprises:
    a polysilicon layer; and
    a silicide layer, formed on the polysilicon layer,
    the first terminal of the e-fuse being a first end of the polysilicon layer and the silicide layer, the second terminal of the e-fuse being a second end of the of the polysilicon layer and the silicide layer opposite the first end, and the e-fuse operating in an open state when the silicide layer is broken by burning while one portion of the polysilicon layer is exposed.

13. The e-fuse control circuit as claimed in claim 12, wherein the polysilicon layer has a thickness of 1K to 2K angstroms, and a resistance of 20K to 50K ohms per square unit.

14. The e-fuse control circuit as claimed in claim 12, wherein the silicide layer has a thickness of 200 to 300 angstroms, and a resistance of 5 to 20 ohms per square unit.

15. The e-fuse control circuit as claimed in claim 12, wherein the e-fuse is in the open state when the silicide layer and the polysilicon layer are both broken by burning.

16. The e-fuse control circuit as claimed in claim 12, wherein the polysilicon layer is a lightly doped polysilicon layer.

17. The e-fuse control circuit as claimed in claim 12, wherein the polysilicon layer is an un-doped polysilicon layer.

* * * * *